(12) United States Patent
Wu

(10) Patent No.: US 10,580,694 B2
(45) Date of Patent: Mar. 3, 2020

(54) CONTACT STRUCTURE AND METHOD OF FORMING THE SAME

(71) Applicants: SEMICONDUCTOR MANUFACTURING INTERNATIONAL (SHANGHAI) CORPORATION, Shanghai (CN); SEMICONDUCTOR MANUFACTURING INTERNATIONAL (BEIJING) CORPORATION, Beijing (CN)

(72) Inventor: Jian Wu, Shanghai (CN)

(73) Assignees: SEMICONDUCTOR MANUFACTURING INTERNATIONAL (SHANGHAI) CORPORATION, Shanghai (CN); SEMICONDUCTOR MANUFACTURING INTERNATIONAL (BEIJING) CORPORATION, Beijing (CN)

( * ) Notice: Subject to any disclaimer, the term of this patent is extended or adjusted under 35 U.S.C. 154(b) by 0 days.

(21) Appl. No.: 15/951,033

(22) Filed: Apr. 11, 2018

(65) Prior Publication Data
US 2018/0337086 A1 Nov. 22, 2018

(30) Foreign Application Priority Data
May 19, 2017 (CN) .......................... 2017 1 0355400

(51) Int. Cl.
*H01L 21/768* (2006.01)
*H01L 23/522* (2006.01)
(Continued)

(52) U.S. Cl.
CPC .... *H01L 21/7685* (2013.01); *H01L 21/76816* (2013.01); *H01L 21/76843* (2013.01);
(Continued)

(58) Field of Classification Search
CPC ......... H01L 21/76843; H01L 21/76816; H01L 23/5226
See application file for complete search history.

(56) References Cited

U.S. PATENT DOCUMENTS 7,611,991 B2 * 11/2009 Richter ............. H01L 21/76808
257/E21.579
9,548,306 B2 * 1/2017 Basker ............ H01L 21/823814
(Continued)

*Primary Examiner* — Hsien Ming Lee
(74) *Attorney, Agent, or Firm* — Kilpatrick Townsend & Stockton LLP

(57) ABSTRACT

A method for manufacturing a semiconductor device includes providing a substrate structure including a substrate, an active region on the substrate, an electrode in the active region, and an interlayer dielectric layer covering the active region and the electrode. The method also includes etching the interlayer dielectric layer to form a contact hole exposing the electrode, forming a conductive adhesion layer on a bottom and sidewalls of the contact hole, and forming a contact member on the conductive adhesion layer filling the contact hole. The conductive adhesion layer at the bottom and sidewalls of the contact hole prevents the electrode from being oxidized while forming the contact member, thereby effectively reducing the contact resistance and the barrier height of the semiconductor device.

20 Claims, 8 Drawing Sheets

(51) Int. Cl.
    *H01L 27/092*    (2006.01)
    *H01L 21/8238*    (2006.01)
    *H01L 29/78*    (2006.01)
    *H01L 29/417*    (2006.01)

(52) U.S. Cl.
    CPC ............... *H01L 21/76897* (2013.01); *H01L 21/823821* (2013.01); *H01L 23/5226* (2013.01); *H01L 27/0924* (2013.01); *H01L 29/41791* (2013.01); *H01L 29/785* (2013.01)

(56) References Cited

U.S. PATENT DOCUMENTS

| | | | |
|---|---|---|---|
| 10,199,443 B2 * | 2/2019 | Lee | H01L 27/3251 |
| 2012/0309189 A1 * | 12/2012 | Park | H01L 21/31144 |
| | | | 438/643 |
| 2017/0125405 A1 * | 5/2017 | Tanaka | H01G 4/008 |

\* cited by examiner

CONTACT STRUCTURE AND METHOD OF FORMING THE SAME

CROSS-REFERENCES TO RELATED APPLICATIONS

The present application claims priority to Chinese patent application No. 201710355400.8, filed with the State Intellectual Property Office of People's Republic of China on May 19, 2017, the content of which is incorporated herein by reference in its entirety.

FIELD OF THE INVENTION

The present invention relates to semiconductor technology, and more particularly to a semiconductor device and manufacturing method thereof.

BACKGROUND OF THE INVENTION

A Fin Field-Effect Transistor (FinFET) is a new type of complementary metal oxide semiconductor (CMOS) device that has a better short-channel effect control capability, higher drive current and lower power consumption. The low power consumption and small size of the FinFET enable the extension of the Moore's Law to the 14 nm technology node and beyond. FIG. 1A is a cross-sectional view showing an organic distribution layer 1 is formed in a process of forming a contact in the active region of a FinFET, as known in the prior art. FIG. 1B is a cross-sectional view showing the organic distribution layer 1 has been removed exposing the electrodes in the active region, as known in the prior art. Referring to FIG. 1A and FIG. 1B, semiconductor fin 21 is an NFET, and semiconductor fin 22 is a PFET. Electrodes 31 and 33 are sources, and electrodes 32 and 34 are drains of the respective fins 21 and 22. As can be seen in FIG. 1B, due to etching, the silicon in the electrodes in the active region is oxidized to form silicon oxide regions 301, 302, 303, and 304, resulting in higher contact resistance and barrier height, and adversely affecting the semiconductor device quality.

BRIEF SUMMARY OF THE INVENTION

The inventor of the present disclosure discovered the above-described problems and proposes a novel technical solution to solve these problems.

Embodiments of the present disclosure provide a method for manufacturing a semiconductor device. The method may include providing a substrate structure including a substrate, an active region on the substrate, an electrode in the active region, and an interlayer dielectric layer covering the active region and the electrode. The method also includes etching the interlayer dielectric layer to form a contact hole exposing the electrode, forming a conductive adhesion layer on a bottom and sidewalls of the contact hole, and forming a contact member on the conductive adhesion layer filling the contact hole.

In one embodiment, the electrode includes a source electrode and a drain electrode; the contact hole comprises a first contact hole exposing the source electrode and a second contact hole exposing the drain electrode; and the contact member comprises a first contact member filling the first contact hole and a second contact member filling the second contact hole.

In one embodiment, the substrate structure may further include a gate structure on the active region, the source electrode and the drain electrode disposed on opposite sides of the gate structure, and the interlayer dielectric layer covering the gate structure.

In one embodiment, the gate structure includes a gate dielectric layer on a portion of a surface of the active region, and a gate on the gate dielectric layer.

In one embodiment, the method may further include, prior to forming the contact member, forming a sacrificial layer on the substrate structure after forming the conductive adhesion layer, the sacrificial layer filling the contact hole, etching the sacrificial layer and the interlayer dielectric layer to form a connection hole exposing the gate, and removing the sacrificial layer.

In one embodiment, forming the contact member includes concurrently forming a connection member filling the connection hole.

In one embodiment, the active region includes a semiconductor fin.

In one embodiment, the contact hole includes a first portion over the electrode and a second portion over the first portion, the first portion has a lateral width that is smaller than a lateral width of the second portion.

In one embodiment, etching the interlayer dielectric layer includes performing a first etch process on the interlayer dielectric layer to form an opening exposing the electrode, performing a second etch process on a portion of a sidewall of the opening to form the contact hole.

Embodiments of the present invention also provide a semiconductor device. The semiconductor device may include a substrate structure including a substrate, an active region on the substrate, an electrode in the active region, and an interlayer dielectric layer covering the active region and the electrode, a contact hole extending through the interlayer dielectric layer and exposing the electrode, a conductive adhesion layer on a bottom and sidewalls of the contact hole, and a contact member on the conductive adhesion layer filling the contact hole.

In one embodiment, the semiconductor device may further include a connection hole extending through the interlayer dielectric layer and exposing the gate, and a connection member filling the connection hole and in contact with the gate.

In one embodiment, the active region includes a semiconductor fin. In one embodiment, the contact hole includes a first portion over the electrode and a second portion over the first portion, and the first portion has a lateral width that is smaller than a lateral width of the second portion.

The following detailed description together with the accompanying drawings will provide a better understanding of the nature and advantages of the present invention.

BRIEF DESCRIPTION OF THE DRAWINGS

Embodiments of the present invention are described with reference to the accompanying drawings. In the drawings, like reference numbers may indicate identical or functionally similar elements.

DETAILED DESCRIPTION OF THE INVENTION

Figure 1A:
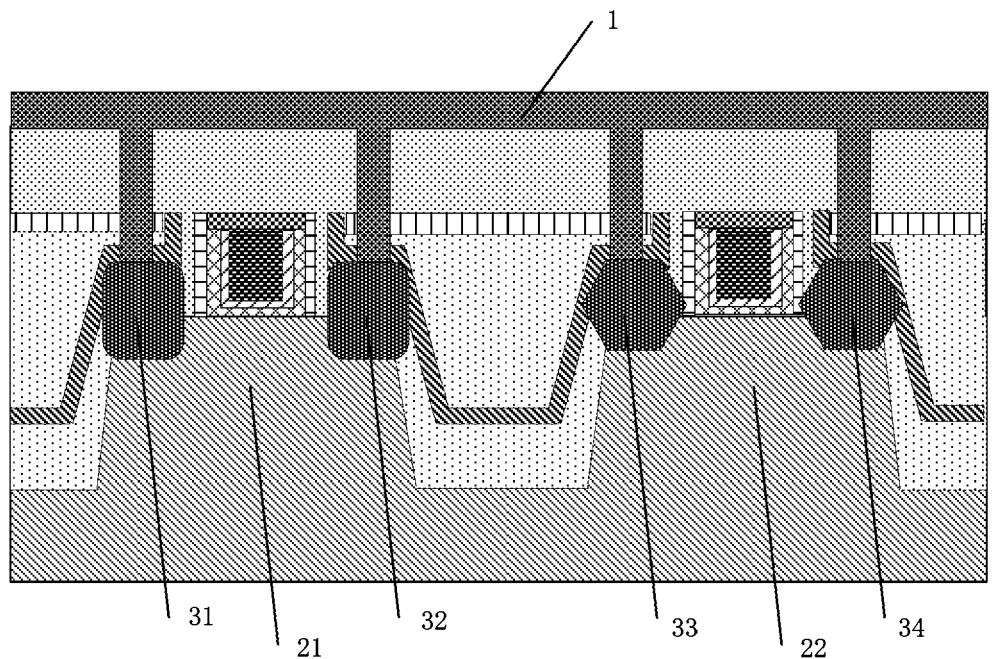
FIG. 1A and FIG. 1B are cross-sectional views showing a stage in the manufacturing process of a semiconductor device according to the prior art.
Figure 1B:
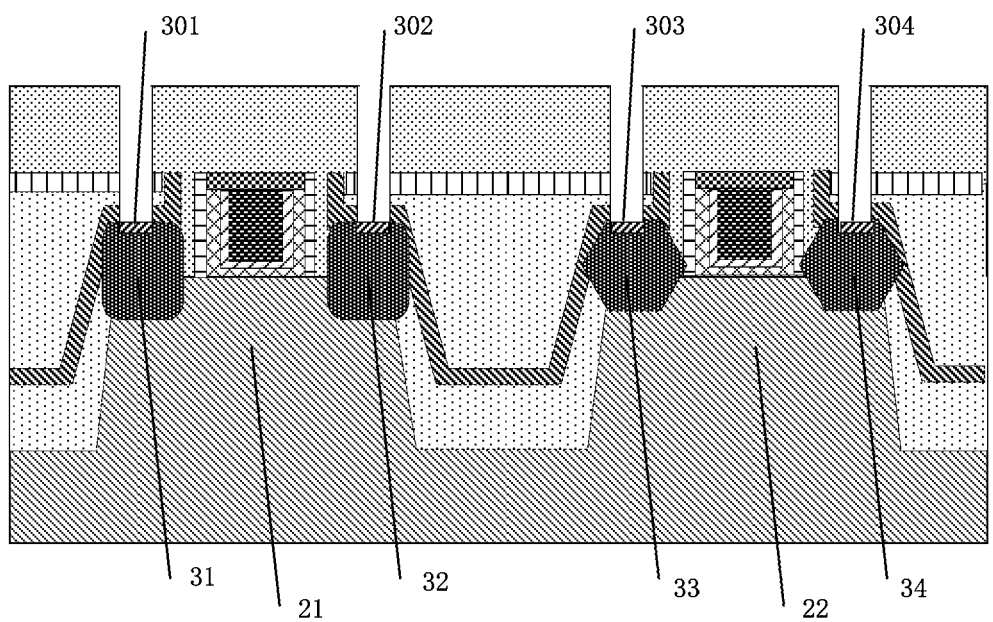

Embodiments of the present invention now will be described more fully hereinafter with reference to the accompanying drawings. The invention may, however, be embodied in many different forms and should not be construed as limited to the embodiments set forth herein. Rather, these embodiments are provided so that this disclosure will be thorough and complete, and will fully convey the scope of the invention to those skilled in the art. The features may not be drawn to scale, some details may be exaggerated relative to other elements for clarity. In the drawings, like numbers refer to like elements throughout.

It will be understood that when an element such as a layer, region or substrate is referred to as being "on" or extending "onto" another element, it can be directly on or extend directly onto the other element or intervening elements may also be present. In contrast; when an element is referred to as being "directly on" or extending "directly onto" another element, there are no intervening elements present. It will also be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present.

Relative terms such as "below" or "above" or "upper" or "lower" or "horizontal" or "Lateral" or "vertical" may be used herein to describe a relationship of one element, layer or region to another element, layer or region as illustrated in the figures. It will be understood that these terms are intended to encompass different orientations of the device in addition to the orientation depicted in the figures.

The terminology used herein is for the purpose of describing particular embodiments only and is not intended to be limiting of the invention. As used herein, the singular form "a", "an", and the does not denote a limitation of quantity, but rather denote the presence of at least one of the referenced items. It will be further understood that the terms "comprises", "comprising", "includes", and/or "including" when used herein, specify the presence of stated features, integers, steps, operations, elements, and/or components, but do not preclude the presence or addition of one or more other features, integers, steps, operations, elements, components, and/or groups thereof.

Embodiments of the invention are described herein with reference to cross-sectional illustrations that are schematic illustrations of idealized embodiments (and intermediate structures) of the invention. The thickness of layers and regions in the drawings may be enlarged relative to other layers and regions for clarity. Additionally, variations from the shapes of the illustrations as a result, for example, of manufacturing techniques and/or tolerances, are to be expected. Thus, embodiments of the invention should not be construed as limited to the particular shapes of regions illustrated herein but are to include deviations in shapes that result, for example, from manufacturing. For example, an implanted region illustrated as a rectangle will, typically, have rounded or curved features and/or a gradient of implant concentration at its edges rather than a discrete change from implanted to non-implanted region. Likewise, a buried region formed by implantation may result in some implantation in the region between the buried region and the surface through which the implantation takes place. Thus, the regions illustrated in the figures are schematic in nature and their shapes are not intended to illustrate the actual shape of a region of a device and are not intended to limit the scope of the invention.

The embodiments described and references in the disclosure to "one embodiment," "an embodiment," "an exemplary embodiment" indicate that the embodiments described may include a particular feature, structure, or characteristic. However, every embodiment may not necessary include the particular feature, structure or characteristic. As used throughout this disclosure, the terms "depositing" and "forming" are used interchangeably.

It should be noted that like reference numerals are used to denote like elements, and once an element has been defined in a drawings, it will not be further described in other drawings.

Figure 2:
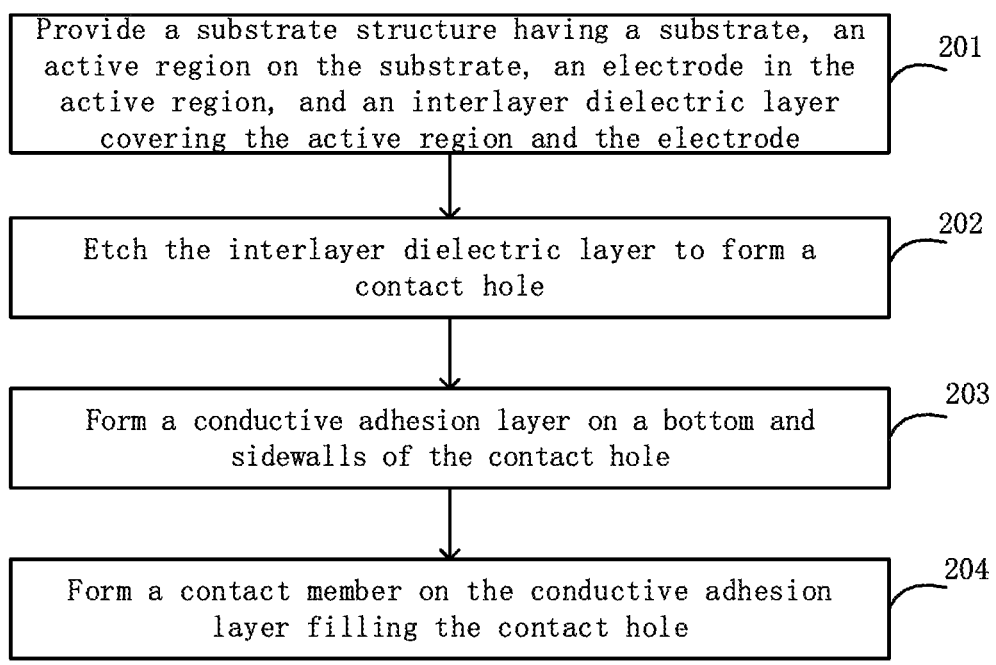
FIG. 2 is a simplified flowchart of a method for manufacturing a semiconductor device according to some embodiments of the present disclosure.

Embodiments of the present invention now will be described more fully hereinafter with reference to the accompanying drawings, in which embodiments of the invention are shown. This invention may, however, be embodied in many different forms and should not be construed as limited to the embodiments set forth herein FIG. 2 is a simplified flowchart of a method for manufacturing a semiconductor device according to some embodiments of the present disclosure. The method may include:

Step 201: providing a substrate structure. The substrate structure may include a substrate, an active region on the substrate, one or more electrodes in the active region, and an interlayer dielectric layer covering at least the active region and the electrodes. In one embodiment, the active region includes a semiconductor fin. In one embodiment, the substrate may be a silicon substrate, the semiconductor fin may include silicon, and the interlayer dielectric layer may include a silicon oxide layer or a silicon nitride layer. In one embodiment, the one or more electrodes may include a source electrode and a drain electrode.

Step 202: etching the interlayer dielectric layer to form contact holes exposing the one or more electrodes. In one embodiment, the contact holes include a first contact hole exposing the source electrode and a second contact hole exposing the drain electrode. The terms source/drain electrode, source/drain, and source/drain regions are often used interchangeably in this field. The present disclosure is applicable to all of the above as they are generally understood in the field.

In one embodiment, each contact hole may include a first (lower) portion over the corresponding electrode and a second (upper) portion over the first portion. The first portion has a lateral width that is smaller than a lateral width of the second portion.

In one embodiment, the step of etching the interlayer dielectric layer to form the contact holes and expose the electrodes may include performing a first etch process into the interlayer dielectric layer, thereby forming an opening exposing the electrodes, and then performing a second etch process to etch a portion of a sidewall of the opening to form the contact holes. The widening of the lateral width of the second (upper) portion of the contact hole improves the performance of the semiconductor device.

Step 203: forming a conductive adhesion layer on the bottom and sidewalls of the contact holes. In one embodiment, the conductive adhesion layer may be formed on the bottom and sidewalls of the contact holes to protect the source and drain electrodes.

Step 204: forming a contact member on the conductive adhesion layer and filling the contact holes. In one embodiment, the contact member includes a first contact member filling the first contact hole and a second contact member filling the second contact hole.

In the present disclosure, the substrate structure is processed to form a conductive adhesion layer on the bottom and sidewalls of the contact holes that extend through the interlayer dielectric layer and expose the electrodes in the active region, so that the electrodes are not oxidized during the formation of the contact member. As a result, the contact resistance and the barrier height of the semiconductor device can be effectively reduced.

In one embodiment, the substrate structure may also include a gate structure on the active region, the source and drain regions (electrodes) are disposed on opposite sides of the gate structure, and the interlayer dielectric layer covers the gate structure.

Figure 3:
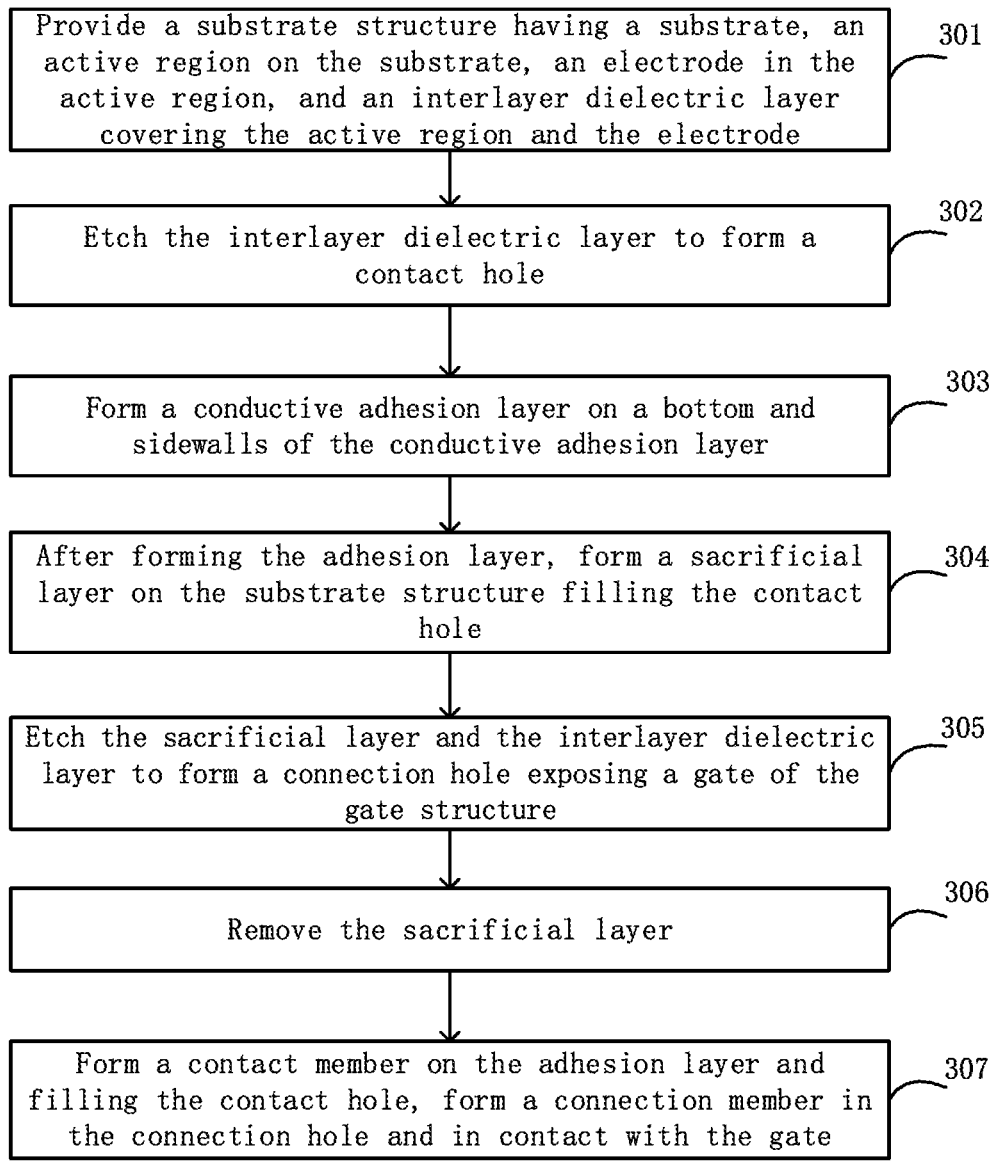
FIG. 3 is a simplified flowchart of a method for manufacturing a semiconductor device according to some embodiments of the present disclosure.

FIG. 3 is a simplified flowchart of a method for manufacturing a semiconductor device according to some embodiments of the present disclosure. The method may include:

Step 301: providing a substrate structure.

In one embodiment, the substrate structure may include a substrate, an active region on the substrate, one or more electrodes in the active region, and an interlayer dielectric layer covering at least the active region and the one or more electrodes. In one embodiment, the one or more electrodes include a source electrode and a drain electrode. In one embodiment, the semiconductor device may also include a gate structure including a gate on the active region, and the interlayer dielectric layer covers the gate structure. In one embodiment, the source electrode and the drain electrode are disposed on opposite sides of the gate structure.

Step 302: etching the interlayer dielectric layer to form contact holes exposing the one or more electrodes. In one embodiment, the contact holes include a first contact hole exposing the source electrode and a second contact hole exposing the drain electrode.

In one embodiment, each contact hole may include a first (lower) portion over the corresponding electrode and a second (upper) portion over the first portion. The first portion has a lateral width that is smaller than a lateral width of the second portion.

Step 303: forming a conductive adhesion layer on the bottom and sidewalls of the contact holes. In one embodiment, the conductive adhesion layer may be formed on the bottom and sidewalls of the contact holes to protect the source and drain electrodes.

Step 304: forming a sacrificial layer on the substrate structure after forming the conductive adhesion layer. The sacrificial layer fills the contact holes.

Step 305: etching the sacrificial layer and the interlayer dielectric layer to form a connection hole exposing the gate of the gate structure.

Step 306: removing the sacrificial layer.

Step 307: forming a contact member on the conductive adhesion layer and filling the contact holes, and forming a connection member in the connection hole and in physical contact with the gate. In one embodiment, the contact member and the connection member may be formed concurrently.

An exemplary embodiment of the present disclosure is described below with reference to the following figures.

FIGS. 4A to 4J are cross-sectional views illustrating intermediate stages of a semiconductor device in a manufacturing method according to some embodiments of the present disclosure.

Figure 4A:
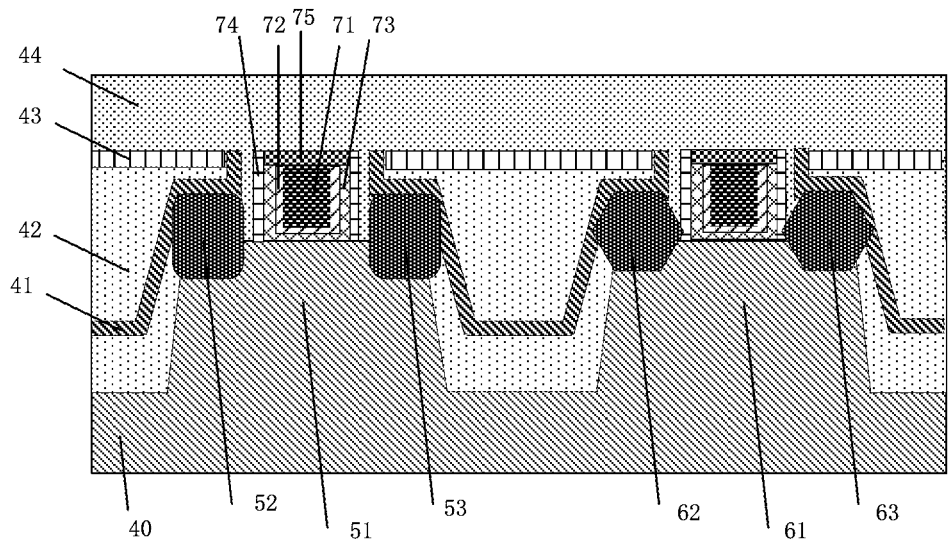
FIGS. 4A to 4J are cross-sectional views illustrating intermediate stages of a semiconductor device in a manufacturing method according to some embodiments of the present disclosure.

Referring to FIG. 4A, a substrate structure is provided. The substrate structure may include a substrate 40, an active region on the substrate, electrodes in the active region, and an interlayer dielectric layer covering the active region and the electrodes. The active region may include a first fin 51 and a second fin 61 on the substrate 40. First fin 51 may be an NFET (n-type FET), and the second fin 61 may be a PFET (p-type FET). First fin 51 may include a source electrode 52 and a drain electrode 53. Second fin 61 may include a source electrode 62 and a drain electrode 63. In addition, the substrate structure may also include a gate structure on the active region. As shown in FIG. 4A, the source electrode 52 and the drain electrode 53 are disposed on opposite sides of the gate structure. The interlayer dielectric layer covers the gate structure.

In one embodiment, the gate structure may include a gate dielectric layer on a surface portion of the active region and a gate on the gate dielectric layer. Referring to FIG. 4A, the gate structure includes a gate electrode 71, a work function adjusting layer 72 surrounding the gate electrode 71 from the side surface and the bottom, a high-k dielectric layer 73 surrounding the side surface and bottom of the work function adjusting layer 72, a spacer 74 on sidewalls of the high-k dielectric layer 73, and a gate insulating layer 75 on the upper surface of the gate 71.

In one embodiment, the substrate structure may further include a first insulator layer 41 on the electrodes, a second insulator layer 42 on the first insulator layer 41, a first dielectric layer 43 on the source electrodes and the drain electrodes and on the second insulator layer 42, and a second dielectric layer 44 on the source and drain electrodes of the active region, the first dielectric layer 43, and the gate structure. In one embodiment, the first insulator layer 41, the second insulator layer 42, the first dielectric layer 43, and the second dielectric layer 44 form the interlayer dielectric layer.

Figure 4B:
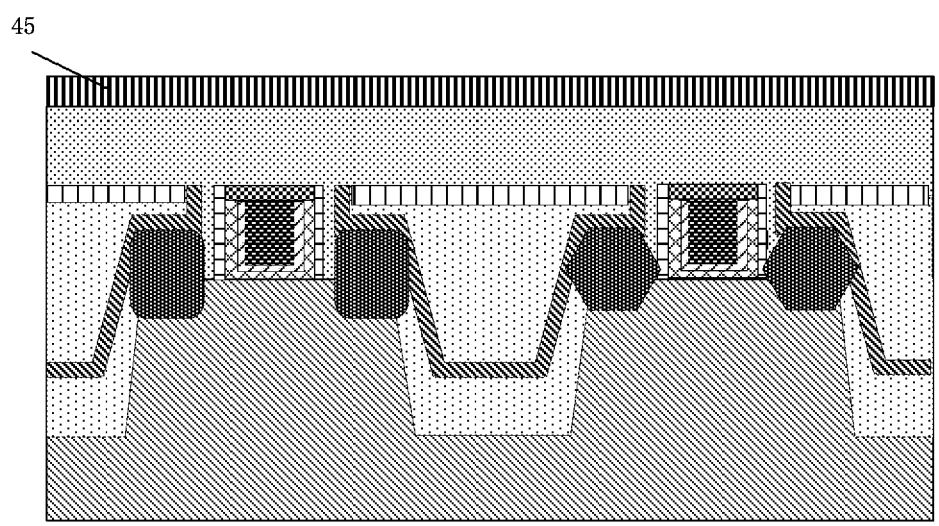

Referring to FIG. 4B, a hardmask layer 45 is formed on the substrate structure including the gate structure.

Figure 4C:
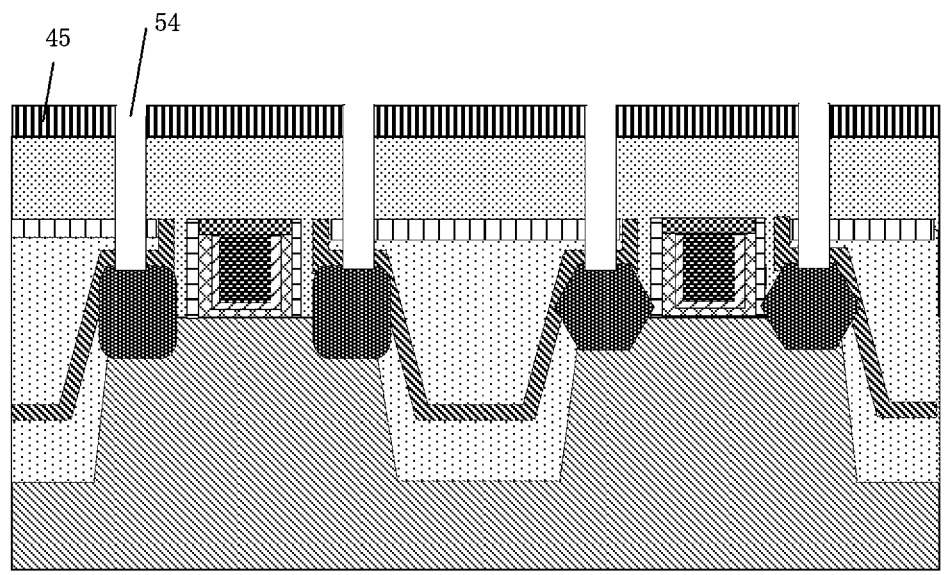

Referring to FIG. 4C, the hardmask layer 45 is patterned to form a contact hole 54 extending through the hardmask layer 45 and the interlayer dielectric layer (i.e., second dielectric layer 44, first dielectric layer 43, second insulator layer 42, and first insulator layer 41) and exposing a surface of the source and drain electrodes.

Figure 4D:
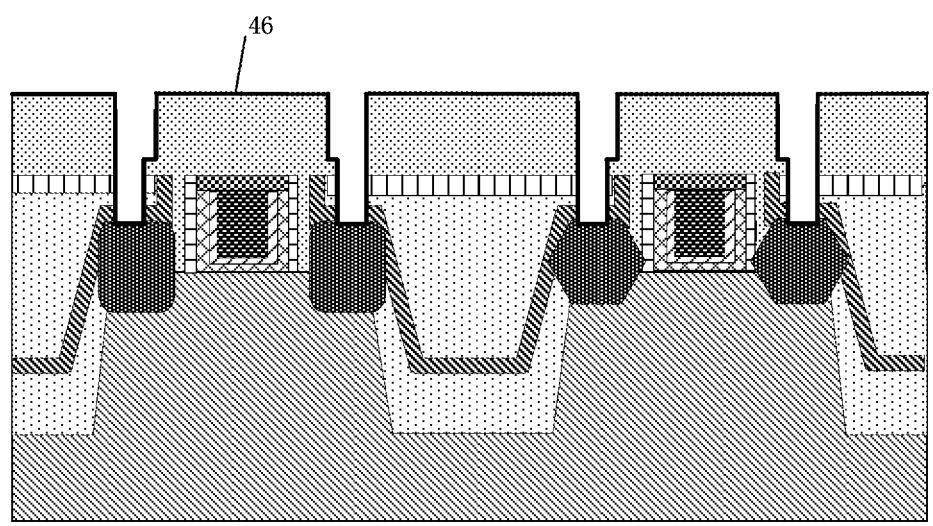

Referring to FIG. 4D, the hardmask layer 45 is removed. A conductive adhesion layer 46 is concurrently formed on the bottom and sidewalls of the contact hole.

In one embodiment, referring to FIG. 4C, the step of etching the interlayer dielectric layer to form a contact hole exposing the electrodes may include performing a first etch process on the interlayer dielectric layer to form an opening exposing a surface of the electrodes, and then performing a second etch process to etch a portion of a sidewall of the openings to form a contact hole. The thus formed contact hole has a first portion on the electrodes and a second portion on the first portion, wherein the first portion has a lateral width that is smaller than a lateral width of the second portion, as shown in FIG. 4D.

Figure 4E:
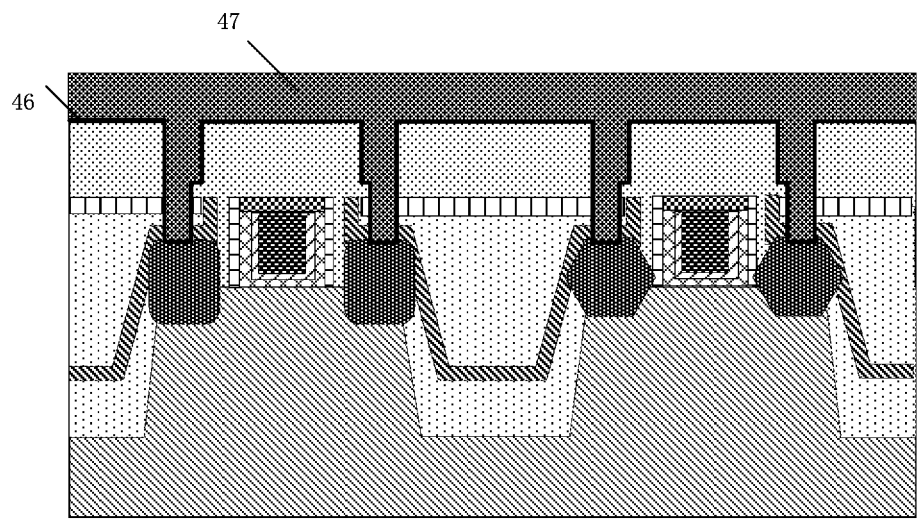

Referring to FIG. 4E, a sacrificial layer 47 is formed on the substrate structure after forming the conductive adhesion layer 46 on the bottom and sidewalls of the contact hole. The sacrificial layer 47 fills the contact hole. In one embodiment, the sacrificial layer 47 may include an organic distribution layer.

Figure 4F:
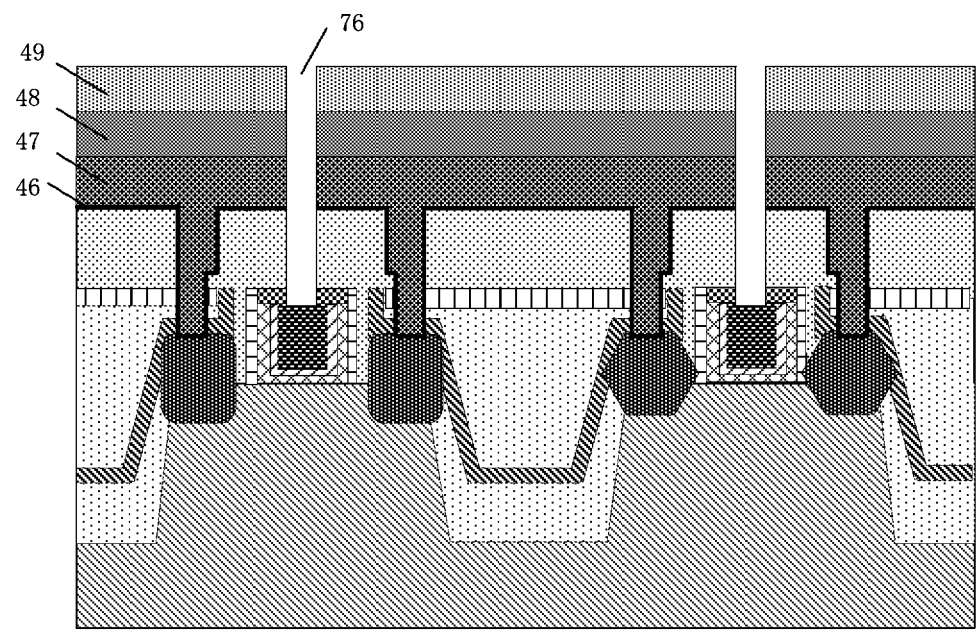

Referring to FIG. 4F, a mask is formed on the sacrificial layer 47. In one embodiment, the mask may include an anti-reflection layer 48 and a photoresist 49. The photoresist 49, the anti-reflection layer 48, and the sacrificial layer 47 are etched to form a connection hole 76 exposing a surface of the gate.

Figure 4G:
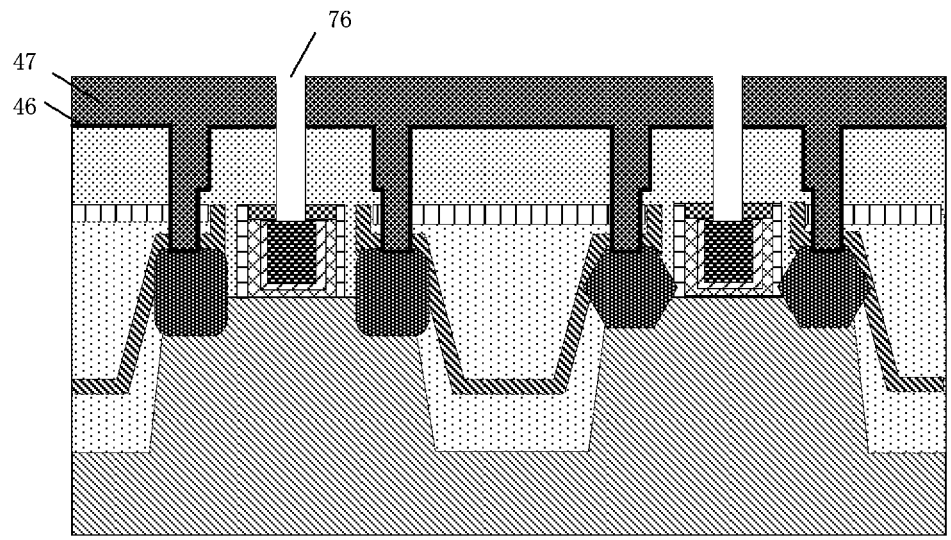

Referring to FIG. 4G, the photoresist 49 and the anti-reflection layer 48 are removed.

Figure 4H:
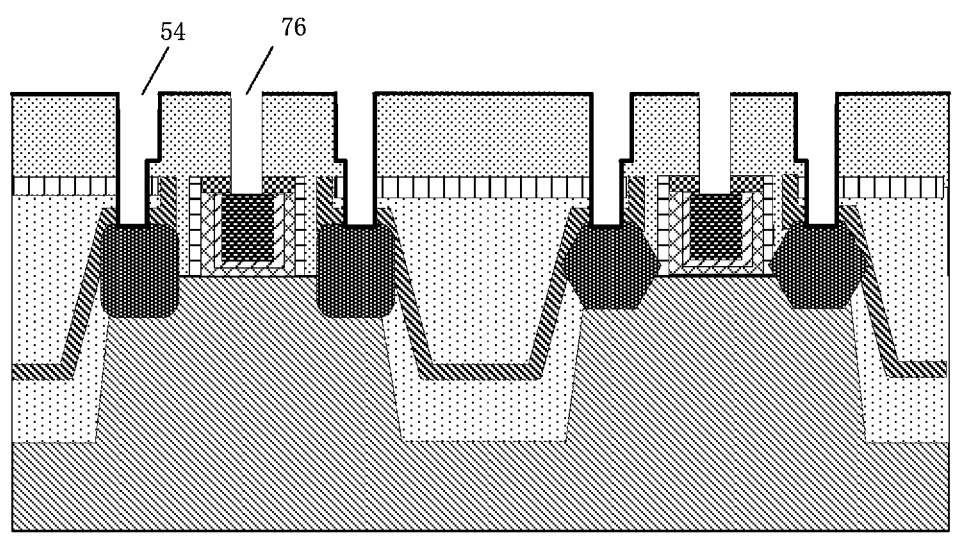

Referring to FIG. 4H, the sacrificial layer 47 is removed. In one embodiment, the sacrificial layer may be removed using a wet etch process, a dry etch process, or a a combination of the wet etch and dry etch processes. It should be noted that, since the conductive adhesion layer 46 is first formed on the bottom and sidewalls of the contact hole, the silicon residing in the electrodes will not be oxidized when the sacrificial layer 47 is etched, thereby effectively reducing the contact resistance and the barrier height of the semiconductor device.

Figure 4I:
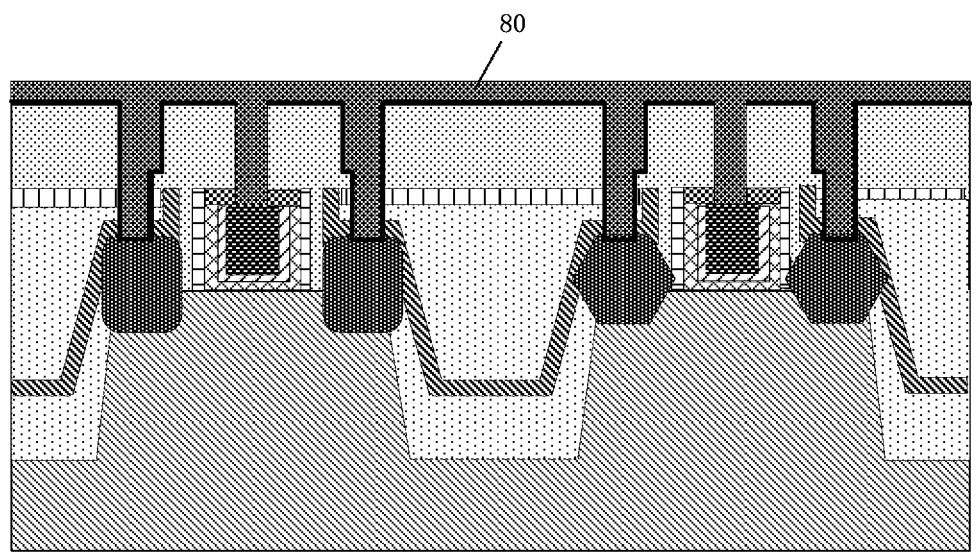

Referring to FIG. 4I, a conductive material layer 80 is formed on the substrate structure to fill the contact hole 54 and the connection hole 76.

Figure 4J:
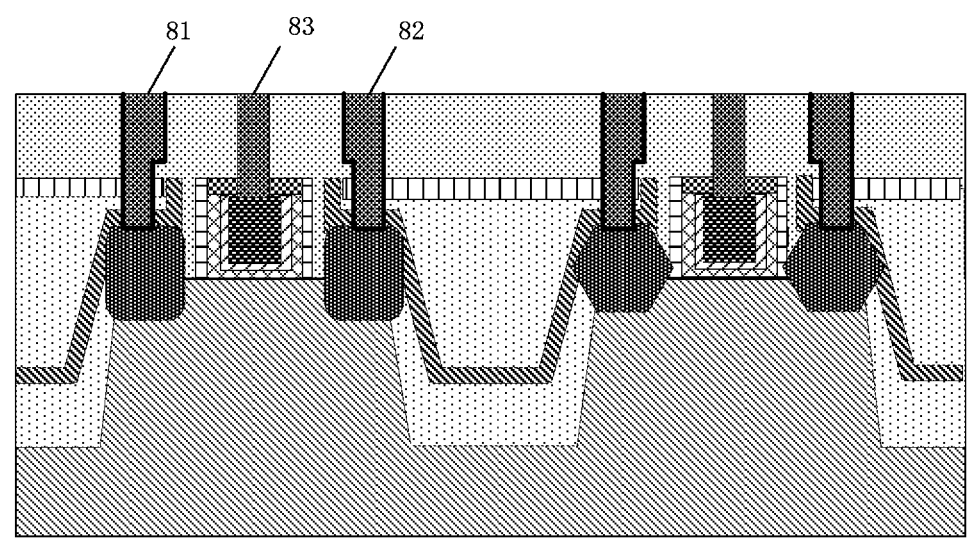

Referring to FIG. 4J, a planarization (e.g., a chemical mechanical polishing) process is carried out on the conductive material layer 80 to obtain a first contact 81 in physical contact with the source electrode, a second contact 82 in physical contact with the drain electrode, and a connection member 83 in physical contact with the gate.

Embodiments of the present disclosure also provide a semiconductor device. Referring to FIG. 4J, the semiconductor device includes a substrate structure including a substrate, an active region on the substrate, one or more electrodes in the active region, and an interlayer dielectric layer covering the active region and the electrodes. In one embodiment, the active region may include a semiconductor fin.

In one embodiment, the one or more electrodes include a source electrode and a drain electrode.

In one embodiment, the semiconductor device may further include a contact hole extending through the interlayer dielectric layer and exposing a surface of the electrodes, a conductive adhesion layer 46 on the bottom and sidewalls of the contact hole, and a contact member including a first contact member 81 and a second contact member 82 on the conductive adhesion layer 46 and filling the contact hole.

In one embodiment, the contact hole includes a first contact hole exposing the source electrode and a second contact hole exposing the drain electrode. The contact member includes the first contact member filling the first contact hole and the second contact member filling the second contact hole.

In one embodiment, the contact hole includes a first portion over the electrode(s) and a second portion over the first portion, wherein the first portion has a lateral width that is smaller than a lateral width of the second portion, as shown in FIG. 4D.

In one embodiment, the substrate structure further includes a gate structure on the active region. The source electrode and the drain electrode are disposed on opposite sides of the gate structure, and the interlayer dielectric layer covers the gate structure. In one embodiment, the gate structure includes a gate dielectric layer on a surface portion of the active region and a gate on the gate dielectric layer, as shown in FIG. 4A.

In one embodiment, the semiconductor device may further include a connection hole 76 extending through the interlayer dielectric layer and exposing an upper surface of the gate, as shown in FIG. 4F. In one embodiment, the semiconductor device may further include a connection member 83 filling the connection hole and in physical contact with the gate, as shown in FIG. 4J.

In accordance with the present invention, a conductive adhesion layer is formed on the bottom and the sidewalls of the contact hole that extends through the interlayer dielectric layer to expose a surface of the electrode in the active region, so as to prevent the electrode from being oxidized when the contact member is formed, so that the contact resistance and the barrier height of the semiconductor device can be effectively reduced.

In accordance with the present invention, in the method of manufacturing a semiconductor device, a contact hole is formed extending to the source and drain electrodes by patterning a hardmask layer, a conductive adhesion layer is formed on the bottom and sidewalls of the contact hole at the same time (concurrently) when the hardmask layer is removed to protect the source and drain electrodes. The conductive adhesion layer may include a polymer resin including electrically conducting particles. A sacrificial layer is then formed on the substrate structure after forming the conductive adhesion layer filling the contact hole. An etch process is carried out on the sacrificial layer and the interlayer dielectric layer to form a connection hole exposing an upper surface of the gate. Next, the sacrificial layer is removed. Thereafter, a conductive material layer is formed on the substrate structure filling the contact hole and the connection hole.

The manufacturing method of the present invention is particularly well suited for forming a semiconductor device having significantly reduced contact resistance and barrier height.

The foregoing descriptions of specific embodiments of the present invention have been presented for purpose of illustration and description. They are not intended to be exhaustive or to limit the invention to the precise forms disclosed, and obviously many modifications and variations are possible in light of the above disclosure. The exemplary embodiments have been described in order to best explain the principles of the invention and its practical application. Many embodiments will be apparent to those of skill in the art upon reviewing the above description. The scope of the invention should, therefore, be determined not with reference to the above description, but instead should be determined with reference to the appended claims along with their full scope of equivalents.

What is claimed is:

1. A method for manufacturing a semiconductor device, the method comprising:
   providing a substrate structure including a substrate, an active region on the substrate, an electrode comprising a source electrode and a drain electrode in the active region, and an interlayer dielectric layer covering the active region and the electrode;
   etching the interlayer dielectric layer to form a contact hole comprising a first contact hole exposing the source electrode and a second contact hole exposing the drain electrode;
   forming a conductive adhesion layer comprising a polymer resin including electrically conducting particles on a bottom and sidewalls of the contact hole; and
   forming a contact member on the conductive adhesion layer, the contact member comprising a first contact member filling the first contact hole and a second contact member filling the second contact hole.

2. The method of claim 1, wherein the substrate structure further comprises a gate structure on the active region, the source electrode and the drain electrode on opposite sides of the gate structure, and the interlayer dielectric layer covering the gate structure.

3. The method of claim 2, wherein the gate structure comprises a gate dielectric layer on a portion of a surface of the active region, and a gate on the gate dielectric layer.

4. The method of claim 1, further comprising, prior to forming the contact member:
forming a sacrificial layer on the substrate structure after forming the conductive adhesion layer, the sacrificial layer filling the contact hole;
etching the sacrificial layer and the interlayer dielectric layer to form a connection hole exposing a gate structure on the active region; and
removing the sacrificial layer.

5. The method of claim 4, wherein forming the contact member comprises concurrently forming a connection member filling the connection hole.

6. The method of claim 1, wherein the active region comprises a semiconductor fin.

7. The method of claim 1, wherein the contact hole comprises a first portion over the electrode and a second portion over the first portion, the first portion having a lateral width that is smaller than a lateral width of the second portion.

8. The method of claim 7, wherein etching the interlayer dielectric layer comprises:
performing a first etch process on the interlayer dielectric layer to form an opening exposing the electrode;
performing a second etch process on a portion of a sidewall of the opening to form the contact hole.

9. The method of claim 1, wherein the substrate structure further comprise a gate structure on the active region, the method further comprising, after forming the conductive adhesion layer on the bottom and the sidewalls of the contact hole:
forming a sacrificial layer on the interlayer dielectric layer and filling the contact hole;
removing a portion of the sacrificial layer and a portion of the interlayer dielectric layer to form a connection hole exposing a surface of the gate structure, a remaining portion of the sacrificial layer covering the contact hole;
removing the remaining portion of the sacrificial layer exposing the contact hole; and
concurrently forming a connection member in the connection hole with forming the contact member in the contact hole.

10. The method of claim 9, wherein the gate structure comprises:
a gate electrode having a side surface and a bottom;
a work function adjusting layer surrounding the side surface and the bottom of the gate electrode;
a high-k dielectric layer surrounding a side surface and a bottom of the work function adjusting layer; and
a spacer on sidewalls of the high-k dielectric layer.

11. The method of claim 1, further comprising, prior to etching the interlayer dielectric layer:
forming a patterned hardmask layer on the interlayer dielectric layer,
wherein etching the interlayer dielectric layer is performed using the patterned hardmask layer as a mask, and
wherein forming the conductive adhesion layer is performed concurrently with removing the patterned hardmask layer.

12. A semiconductor device, comprising:
a substrate structure including a substrate, an active region on the substrate, an electrode comprising a source electrode and a drain electrode in the active region, and an interlayer dielectric layer covering the active region and the electrode;
a contact hole extending through the interlayer dielectric layer, the contact hole comprising a first contact hole exposing the source electrode and a second contact hole exposing the drain electrode;
a conductive adhesion layer comprising a polymer resin including electrically conducting particles on a bottom and sidewalls of the contact hole; and
a contact member on the conductive adhesion layer, the contact member comprising a first contact member filling the first contact hole and a second contact member filling the second contact hole.

13. The semiconductor device of claim 12, wherein the substrate structure further comprises a gate structure on the active region, the source electrode and the drain electrode on opposite sides of the gate structure, and the interlayer dielectric layer covering the gate structure.

14. The semiconductor device of claim 13, wherein the gate structure comprises a gate dielectric layer on a portion of a surface of the active region, and a gate on the gate dielectric layer.

15. The semiconductor device of claim 14, further comprising:
a connection hole extending through the interlayer dielectric layer and exposing the gate; and
a connection member filling the connection hole and in contact with the gate.

16. The semiconductor device of claim 12, wherein the active region comprises a semiconductor fin.

17. The semiconductor device of claim 12, wherein the contact hole comprises a first portion over the electrode and a second portion over the first portion, the first portion having a lateral width that is smaller than a lateral width of the second portion.

18. The semiconductor device of claim 12, further comprising:
a gate electrode on the active region, the gate electrode having a side surface and a bottom;
a work function adjusting layer surrounding the side surface and the bottom of the gate electrode;
a high-k dielectric layer surrounding a side surface and a bottom of the work function adjusting layer; and
a spacer on sidewalls of the high-k dielectric layer.

19. A method for manufacturing a semiconductor device, the method comprising:
providing a substrate structure including a substrate, an active region on the substrate, an electrode in the active region, and an interlayer dielectric layer covering the active region and the electrode;
etching the interlayer dielectric layer to form a contact hole exposing the electrode;
forming a conductive adhesion layer comprising a polymer resin including electrically conducting particles on a bottom and sidewalls of the contact hole;
forming a sacrificial layer on the substrate structure after forming the conductive adhesion layer, the sacrificial layer filling the contact hole;
etching the sacrificial layer and the interlayer dielectric layer to form a connection hole exposing a gate structure on the active region;
removing the sacrificial layer; and
forming a contact member on the conductive adhesion layer filling the contact hole.

20. The method of claim 19, wherein forming the contact member comprises concurrently forming a connection member filling the connection hole.

* * * * *